US008250420B2

(12) United States Patent
Hapke et al.

(10) Patent No.: US 8,250,420 B2
(45) Date of Patent: Aug. 21, 2012

(54) TESTABLE INTEGRATED CIRCUIT AND TEST DATA GENERATION METHOD

(75) Inventors: Friedrich Hapke, Winsen/Luhe (DE); Michael Wittke, Pinneberg (DE); Juergen Schloeffel, Buchholz (DE)

(73) Assignee: NXP B.V., Eindhoven (NL)

( * ) Notice: Subject to any disclaimer, the term of this patent is extended or adjusted under 35 U.S.C. 154(b) by 448 days.

(21) Appl. No.: 12/594,594

(22) PCT Filed: Apr. 3, 2008

(86) PCT No.: PCT/IB2008/051250
§ 371 (c)(1),
(2), (4) Date: Oct. 3, 2009

(87) PCT Pub. No.: WO2008/122937
PCT Pub. Date: Oct. 16, 2008

(65) Prior Publication Data
US 2010/0117658 A1 May 13, 2010

(30) Foreign Application Priority Data
Apr. 5, 2007 (EP) .................................... 07105771

(51) Int. Cl.
*G01R 31/28* (2006.01)
(52) U.S. Cl. ........................................ 714/728; 714/731
(58) Field of Classification Search .................. 714/724, 714/726, 728, 731, 732, 736
See application file for complete search history.

(56) References Cited

U.S. PATENT DOCUMENTS
5,826,071 A * 10/1998 Narayan ........................ 712/224
6,173,386 B1 * 1/2001 Key et al. ....................... 712/10
7,404,126 B2 * 7/2008 Jain et al. ...................... 714/726
2002/0069387 A1 6/2002 Hapke
2002/0124217 A1 9/2002 Hiraide et al.
(Continued)

FOREIGN PATENT DOCUMENTS
JP 2001-249164 A 9/2001
(Continued)

OTHER PUBLICATIONS

Yuyi Tang; Wunderlich, H.-J.; Vranken, H.; Hapke, F.; Wittke, M.; Engelke, P.; Polian, I.; Becker, B.; , "X-masking during logic BIST and its impact on defect coverage," Test Conference, 2004. Proceedings. ITC 2004. International , vol., no., pp. 442-451, Oct. 26-28, 2004.*

(Continued)

*Primary Examiner* — Cynthia Britt

(57) ABSTRACT

An integrated circuit (IC) is disclosed that comprises a circuit portion (100) having a plurality of inputs (102) and a plurality of outputs (106), the plurality of inputs being arranged to receive a test pattern in a test mode of the integrated circuit, the test pattern comprising a plurality of test vectors for feeding to the plurality of inputs in successive clock cycles. The IC also comprises a test arrangement for testing the circuit portion (100), comprising a test pattern generator (110) for generating the test pattern, masking logic (150) for masking selected outputs of the plurality of outputs (106) and a signal generator (130) coupled to the masking logic (150) for generating a masking signal triggering the masking of all of said circuit portion outputs during selected cycles of the successive clock cycles, the signal generator (130) being responsive to clock cycle selection data ($s_1$-$s_t$). This way, selected clock cycles or individual flip-flops can be masked out without requiring external control signals. The IC may also comprise a mask storage arrangement (115) for storing masks to mask a plurality of scan chains for all cycles within a pattern.

17 Claims, 2 Drawing Sheets

U.S. PATENT DOCUMENTS

2003/0115521 A1    6/2003    Rajski et al.
2005/0060625 A1    3/2005    Wang et al.
2007/0234169 A1*  10/2007  Rajski et al. .................. 714/742

FOREIGN PATENT DOCUMENTS

WO    2005/010932 A    2/2005
WO    2005/031378 A    4/2005

OTHER PUBLICATIONS

Masayuki Arai; Satoshi Fukumoto; Kazuhiko Iwasaki; Tatsuru Matsuo; Takahisa Hiraide; Hideaki Konishi; Michiaki Emori; Takashi Aikyo; , "Test Data Compression of 100x for Scan-Based BIST," Test Conference, 2006. ITC '06. IEEE International , vol., no., pp. 1-10, Oct. 2006.*

Chickermane, V.; Foutz, B.; Keller, B.; , "Channel masking synthesis for efficient on-chip test compression," Test Conference, 2004. Proceedings. ITC 2004. International , vol., no., pp. 452- 461, Oct. 26-28, 2004.*

Pomeranz, I.; Sandip Kundu; Reddy, S.M.; , "Masking of unknown output values during output response compression by using comparison units," Computers, IEEE Transactions on , vol. 53, No. 1, pp. 83-89, Jan. 2004.*

* cited by examiner

TESTABLE INTEGRATED CIRCUIT AND TEST DATA GENERATION METHOD

The present invention relates to an integrated circuit comprising a circuit portion having a plurality of inputs and a plurality of outputs, the plurality of inputs being arranged to receive a test pattern in a test mode of the integrated circuit, the test pattern comprising a plurality of test vectors for feeding to the plurality of inputs in successive clock cycles; and a test arrangement for testing the circuit portion, the test arrangement comprising a test pattern generator for generating the test pattern and masking logic for masking selected outputs of the plurality of outputs.

The present invention further relates to a method for generating test data for such an integrated circuit.

Today, many integrated circuits (ICs) have a high integration density, which makes it difficult and costly to exhaustively test these ICs. For instance, complex testers storing a large number of test vectors have to be used if such an IC is to be tested using such a tester Such testers are expensive and the time it takes to test the IC may be very long because of the large amount of test data that has to be transferred between the tester and the IC under test at relatively low speed.

For this reason, on-chip test compression techniques are becoming increasingly popular, because these techniques obviate the need for expensive external test systems and significantly reduce the test time of the IC because the amount of data that has to be transferred between the IC and external tester is significantly reduced and the test can be performed internally at higher speeds.

Many examples of such on-chip architectures exist. For instance, in PCT patent application WO 2005/031378 an IC is described that includes test result compaction circuitry coupled between a circuit portion under test (CUT) and an output of the IC. The test result compaction circuitry comprises a multiple input shift register (MISR) for compacting the test responses of the CUT. So-called X-masking logic is placed between the inputs of the MISR and the outputs of the CUT to mask those outputs of the CUT that are expected to have an undefined value in response to a predefined test pattern, because such undefined values would make the output of the MISR unreliable at best. The X-masking logic receives configuration data from the automatic test equipment (ATE) to mask the appropriate outputs of the CUT. The data to configure the X-masking logic for a test pattern is referred to as a configuration word. In addition, the X-masking logic is sensitive to a mask-all signal from the ATE to mask all outputs of the CUT that are coupled to the test result compaction circuitry.

However, such an approach cannot be used for ICs having a built-in self test (BIST) architecture because such ICs are not tested with an ATE. Instead, an automated test pattern generation (ATPG) tool can be used to calculate the X-masking configuration words for each clock cycle of each test pattern, and store these words in a read-only memory (ROM). Because ROMs are expensive, typically one configuration word per test pattern is stored in the ROM to limit the size of the ROM. Because a single test pattern is typically applied over a plurality of clock cycles, i.e. typically comprises a plurality of test vectors, with the vectors being applied to the inputs of the circuit portion under test one at a time in successive clock cycles, this approach has the drawback that the mask_all signal cannot be used, because the test results for all these cycles would be lost.

The present invention seeks to provide an integrated circuit according to the opening paragraph that allows for more versatile masking of the outputs of its circuit portion under test.

The present invention further seeks to provide a method for generating test data for such an integrated circuit.

According to an aspect of the present invention, there is provided an integrated circuit comprising a test pattern generator; a circuit portion having a plurality of inputs and a plurality of outputs, the plurality of inputs being arranged to receive a test pattern from the test pattern generator in a test mode of the integrated circuit, the test pattern comprising a plurality of test vectors for feeding to the plurality of inputs in successive clock cycles; and a test arrangement for testing the circuit portion, the test arrangement comprising: masking logic for masking selected outputs of the plurality of outputs; and a signal generator coupled to the masking logic for generating a signal triggering the masking of all of said circuit portion outputs during a selected cycles of the successive clock cycles in response to clock cycle selection data.

The test arrangement of the present invention allows for the selection of specific clock cycles from the plurality of clock cycles covered by a single test pattern. Consequently, during these clock cycles, all outputs of the circuit portion under test can be masked, thus improving the resolution of the test results. This is particularly advantageous if the outputs of the masking logic are coupled to data compression logic such as a multiple input shift register (MISR), because the output of a MISR becomes meaningless when provided with an undefined input. Hence, the masking of selected clock cycles avoids the need of having to mask all clock cycles for a given test pattern if the circuit portion under test produces undefined output signals in only some of the clock cycles.

In a preferred embodiment, the configurable signal generator comprises a clock cycle counter and a comparator for comparing the clock cycle selection data with the clock cycle counter value. For instance, the clock cycle selection data may comprise a plurality of bits, the clock cycle counter may comprise a plurality of counter bits and the comparator may comprise a plurality of logic gates, each logic gate being configured to compare a clock cycle selection data bit with a corresponding counter bit, the configurable signal generator being configured to generate the signal when at least one of the clock cycle selection data bits matches the corresponding counter bit.

This has the advantage that the signal generator can be realized with relatively little area overhead. Typically, the number of clock cycle selection bits matches the number of clock cycles covered by a test pattern. This number usually corresponds with the depth of the shift registers between the inputs and outputs of the circuit portion under test.

Advantageously, the test arrangement comprises means for inverting the signal, such as an exclusive logic gate being responsive to the signal and an inversion signal. This has the advantage that the inverse of the clock cycle selection can be generated without having to reconfigure the signal generator.

Preferably, the test arrangement further comprises a memory device for storing a plurality of multi-bit masks, the masking logic being configurable by said masks, the memory device being responsive to mask selection data. This has the advantage that masks can be provided that facilitate the masking of selected scan chains for all clock cycles of a test pattern. These masks may be combined with the masks generated by the masking logic, which reduces the number of clock cycles for which all outputs have to be masked, because a wider variety of masks can be generated.

Advantageously, the memory device, such as a programmable logic array (PLA), is responsive to a further inversion signal for producing the inverse of a selected multi-bit mask. This has the advantage that the memory device does not have to store the whole mask, providing that its inverse is available. Consequently, the memory device for storing N masks (N being a positive integer) can produce a maximum of 2N masks.

The various configuration data such as the clock cycle selection data, the mask selection data and the inversion bits may be combined into a single configuration word per test pattern or group of test patterns, which may be stored in a further memory device, e.g. a ROM, a PLA, or a reprogrammable memory device such as a RAM.

According to a further aspect of the present invention, there is provided a method generating a test pattern for feeding to the plurality of inputs over a plurality of clock cycles; determining the expected responses to the test pattern on the plurality of outputs, the expected responses including undefined values; determining, for said test pattern, the clock cycles in which all outputs from said plurality of outputs need masking; generating clock cycle selection data for configuring the signal generator to generate the masking signal in the determined clock cycles; and generating masking data for the undefined values in unmasked clock cycles.

This facilitates automated generation of the test patterns and the masking signal configuration data, for instance by means of an ATPG tool.

The invention is described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

Figure 1:
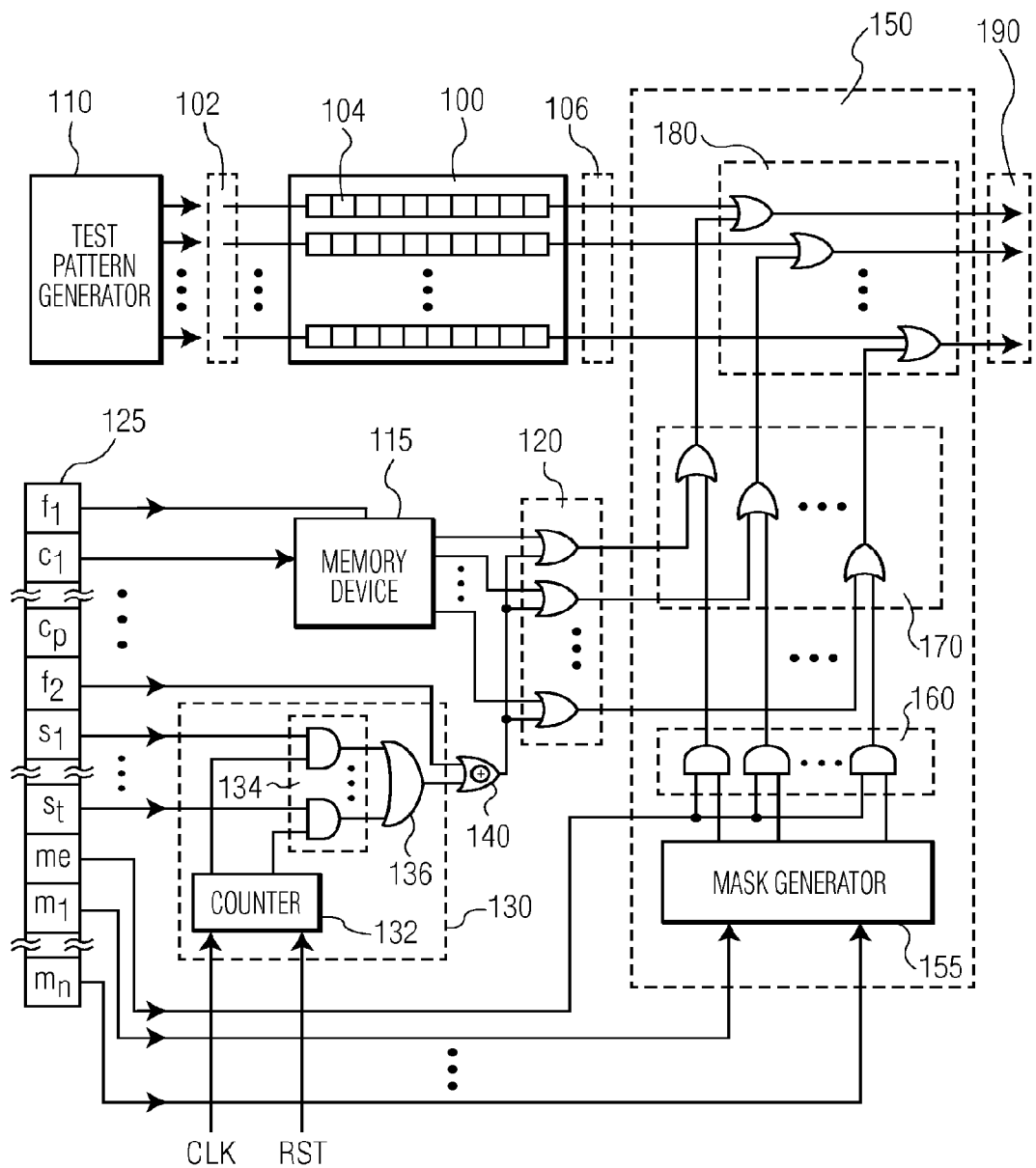
FIG. 1 shows an embodiment of an IC of the present invention.

FIG. 1 shows an IC according to the present invention. The IC has a circuit portion 100 with a plurality of inputs 102, a plurality of outputs 106 and a plurality of shift registers 104, each shift register being coupled between an input and an output. The shift registers 104 are configured to transport test stimuli from the inputs 102 to logic (not shown) of the circuit portion 100 and to transport test results from the logic (not shown) to the outputs 106 in a test mode of the IC.

The IC further comprises a test arrangement for executing a built-in self test of the circuit portion 100. The test arrangement comprises a test pattern generator 110 that provides the inputs 102 with test stimuli in the form of test patterns. The test arrangement further comprises masking logic 150 for masking those outputs 106 that are expected to produce an undefined value, i.e. an X-value, in response to a test vector applied to the inputs 102. The principle of masking X-values, i.e. X-masking has been described in detail in PCT patent application WO 2005/031378; see for instance FIG. 2 and its detailed description in this application. The same principle applies to the IC of the present invention.

The masks for the masking logic 150 may be generated in a number of ways. The IC may have a memory device 115 storing predefined masks, or may have an on-the-fly mask generator 155 such as a LFSR, which may be combined with a phase shifting stage, as explained in FIG. 1 and its detailed description in PCT patent application WO 2005/031378.

Preferably, the IC comprises both the memory device 115 and the mask generator 155, as will be explained in more detail below.

The IC further comprises a mask signal generator 130 for generating a mask_all signal, i.e. a signal that triggers the masking of all the outputs 106 in clock cycles specified by clock cycle selection data $s_1$-$s_t$, with t being a positive integer. The mask signal generator 130 may comprise a counter 132 that is responsive to a clock signal CLK and a reset signal RST, and which counts the clock cycles. The counter 132 may be reset with the reset signal RST, which is typically provided when a new test pattern is provided to inputs 102 by test pattern generator 110.

The counter 132 may be implemented as a shift counter, which each shift stage being coupled to a logic gate from the plurality of logic gates 134. The logic gates 134, which preferably are implemented as AND gates, combine the respective bit values of the clock cycle selection data $s_1$-$s_t$ with the respective bit values of the counter 132. The outputs of the logic AND gates 134 are coupled to the inputs of a t-input logic OR gate 136, which generates the mask_all signal if at least one of the logic gates 134 indicates a match between a clock cycle selection data bit and a counter bit. For instance, for t=4, a bit pattern 0001 would cause the generation of a mask_all signal every second clock cycle, i.e. when the least significant bit of the counter equals a logic '1', whereas a bit pattern 0011 would cause the generation of a mask_all signal in the second, third, fourth clock cycle of each set of four clock cycles, i.e. when at least one of the two least significant bits of the counter 132 is a logic '1'.

Optionally, the integrated circuit may further comprise inversion means 140 for inverting the mask signal generated by the signal generator 130. This effectively facilitates the inversion of the clock cycle selection data $s_1$-$s_t$. For instance, for t=4, the bit pattern $s_1$-$s_t$=0011 would cause a generation of a masking signal at every second, third and fourth clock cycle without application of the inversion signal, as explained above, and would cause a generation of a masking signal at the first clock cycle of every four clock cycles in the presence of the inversion signal. A simple implementation of such an inversion circuit 140 is an XOR gate receiving the inversion signal specified by bit f2 and the mask_all signal at its inputs.

The cooperation between the various parts of the test arrangement of the IC of the present invention will be explained in more detail below. In a preferred embodiment, the IC comprises both a memory device 115 such as a ROM or a PLA and a mask generator 155. The memory device 115 is responsive to multi-bit mask selection data $c_1$-$c_p$, with p being a positive integer. Preferably, the memory device is also responsive to a further inversion signal $f_1$, which causes the memory device 115 to invert the multi-bit mask stored in the address location specified by $c_1$-$c_p$. For instance, for a 16-bit mask 0011001100110011 in an address location specified by $c_1$-$c_p$=0001, the presence of inversion signal $f_1$ will cause the memory device 115 to output a mask 1100110011001100. This way, a memory device 115 having only $2^p$ storage locations can produce $2*2^p$ masks. It will be appreciated that the width of the masks typically corresponds to the number of outputs 106 of the CUT 100.

The masks stored in storage device 115 are 'static' in the sense that only a single mask is provided during the t clock cycles in which a test pattern is applied to the inputs 102 of the CUT 100. In other words, the masks stored in storage device 115 can be used to mask selected outputs, i.e. scan chains, during all clock cycles of a particular test pattern. The masks from storage device 115 are typically used when the on-the-fly mask generation logic 155 in incapable of solving the mask equations for all scan chains of CUT 100. The masking of selected scan chain outputs during all clock cycles of a test pattern with a mask from the storage device 115 reduces the complexity of the mask equations to be solved by the mask generation logic 155, because the mask generation logic 155 has less assignments to make, as will be explained in more detail later.

Typically, the mask from the storage device 115 will be chosen based on the predicted responses on the outputs 106 in these clock cycles. For instance, for a CUT having 4 outputs and t=4, the predicted outputs may be:

| Clock cycle | Output response pattern | | | |
|---|---|---|---|---|
| 1 | 1 | X | 0 | X |
| 2 | X | X | X | X |
| 3 | 1 | 0 | 1 | X |
| 4 | 1 | X | 1 | X |

Without the ability to generate a masking signal for a specific clock cycle or a specific output, all these outputs would have to be masked because of the behaviour of all outputs in clock cycle 2 as well as the output behaviour of the last output in all clock cycles. However, according to the present invention, a mask 0001 (i.e. mask the last output) may be selected (the 1s indicating the outputs to be masked) from the storage device 115 together with a clock cycle selection signal $s_1$-$s_t$ applied to the signal generator 130 for masking all the outputs in the second and the forth clock cycle.

It will be appreciated that a good test resolution is obtained; only the test responses on the first and third output in the fourth clock cycle are unnecessarily masked in this example. Ideally, no outputs are unnecessarily masked, but this can sometimes not be realized if in the various clock cycles different numbers of outputs produce undefined values, i.e. X-values. In such cases, it may be necessary to mask some defined outputs either by the masking signal from signal generator 130 or by the mask from the memory device 115, or a combination of masks from these two mask generators. It will be appreciated that this is a large improvement over a solution where all outputs are masked in case the mask generation logic 155 is incapable of solving the masking equations. The outputs of the memory device 115 are fed into respective logic gates 120, with each logic gate 120 also being responsive to the mask_all signal generated by the signal generator 130. In FIG. 1, the logic gates 120 are implemented as OR gates although it will be obvious that alternative implementations are equally feasible. Hence, in the absence of a mask_all signal, the logic gates 120 forward the outputs of the memory device 115 to the masking logic 150, whereas in the presence of the masking signal the logic gates 120 forward the masking signal to the masking logic 150.

An example of a mask generator 155, which decompresses the n mask seeds $m_1$-$m_n$ into a mask of size q is given in PCT patent application WO 2005/031378, as previously indicated. Such a mask generator 155, e.g. a LFSR combined with a phase shifter, typically generates a new mask for every new clock cycle t, in contrast to the 'static' masks in the memory device 115.

The outputs of the mask generator 155 are fed to respective logic gates 160, which are also responsive to a mask enable signal me. In FIG. 1, the logic gates 160 are AND gates, but other implementations are also feasible depending on the conventions used for the masking bits and the mask enable signal me. Consequently, as soon as the masking enable signal me is active, the logic gates 160 forward the mask bits to respective logic gates 170, which also receive the respective outputs from the logic gates 120.

Finally, the outputs of the logic gates 170 are fed into respective logic gates 180, which are OR gates in FIG. 1. Again, other implementations are equally feasible. The logic gates 180 are arranged to mask the outputs 106 of the CUT 100 if so instructed by logic gates 170. The outputs 190 of the logic gates 180 may be analyzed off-chip in an uncompressed form. Preferably, the outputs 190 are compressed by data compression logic (not shown), e.g. a MISR before being offered to an output of the IC for evaluation of the test result.

As previously explained, the masks generated by the mask generator 155 may be combined with the masks from the storage device 115 and/or the mask_all signal generator 130. This allows for the generation of a large number of different masks. This is shown in more detail in FIG. 2, which displays the mask sets generated for a CUT 100 having 6 scan chains (y-axis) and being fed a test pattern with a depth of 10 clock cycles (x-axis). The number of scan chains and clock cycles are chosen by way of example only; typically, these numbers will be significantly larger than depicted in FIG. 2.

Figure 2:
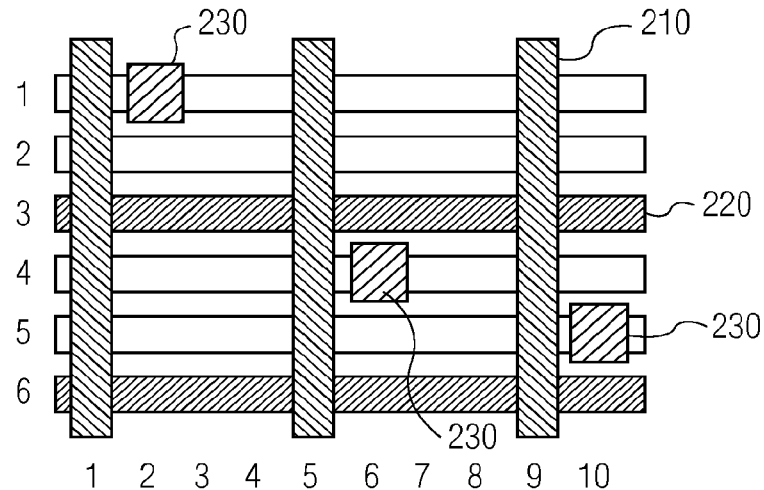
FIG. 2 shows a flowchart of the method of the present invention.

In FIG. 2, all outputs of the CUT 100 have been masked in the first of every four clock cycles by the mask_all signal from mask_all signal generator 130. This may be realized by providing the clock cycle selection data $c_1$-$c_t$ with only the two least significant bits, i.e. bits t-1 and t, being a logic '1' in combination with the bit f2 being a logic '1'. Outputs 3 and 6 of the CUT 100 have been masked out for all clock cycles by a mask 220 from the memory device 115, e.g. a mask 001001, whereas individual outputs have been masked in individual clock cycles by masks 230 generated by mask generation logic 155. It will be apparent that the presence of three different types of mask generation logic provides a large degree of flexibility and versatility in the masks that can be generated, thus provides the IC of the present invention with a BIST arrangement having much improved fault coverage compared to prior art solutions.

It is emphasized that although the above described preferred embodiment of the IC of the present invention includes three different arrangements for generating a mask for the masking of the X responses from outputs 106, i.e. the memory device 115 for masking selected scan chains, the mask_all generation logic 130 and the mask generator 155, that the presence of all these mask sources is not essential for the present invention. For instance, if all required masks for testing the CUT 100 could be stored in the memory device 115, the mask generator 155 may be omitted. Consequently, logic gates 160 and 170 may also be omitted because the outputs of the logic gates 120 may be fed directly into the logic gates 180. Alternatively, if all of the necessary masks can be generated by the mask generator 155, the memory device 115 and the logic gates 120 may be omitted. In the latter arrangement, the masking signal from signal generator 130 is used in the same way as the mask_all signal described in PCT patent application WO 2005/031378, with the significant difference that in the prior art the signal has to be provided by the ATE, whereas the present invention describes an on-chip mask_all signal generation that facilitates a more robust built-in self test arrangement for an IC having a testable circuit portion 100.

Preferably, the various configuration bits $f_1$, $c_1$-$c_p$, $f_2$, $s_1$-$s_t$, me and $m_1$-$m_n$ are grouped into a single test configuration word that corresponds to a particular test pattern. The various test configuration words may be stored in a further memory device (not shown), with the appropriate configuration word being stored into the data register 125 each time a new test pattern is generated by test pattern generator 110.

An important advantage of the integrated circuit shown in FIG. 1 is that the availability of 'static' masks in a memory device 115 provides a flexible and cost-effective test arrangement for the circuit portion 100. For instance, late design changes in the design of circuit portion 100 may not require a redesign of the test arrangement, but may only require a modification of the content of the further memory device storing the various test configuration words. In addition, the availability of an on-chip generated mask_all signal by signal generator 130 reduces the number of defined/undefined assignments to be made to the outputs 106 of the CUT 100 for each clock cycle of a test pattern in the equations for the ATPG tool, and improves the possibility that these equations can be solved, thus increasing the testability and/or reducing the number of required test patterns to test the circuit portion 100.

Figure 3:
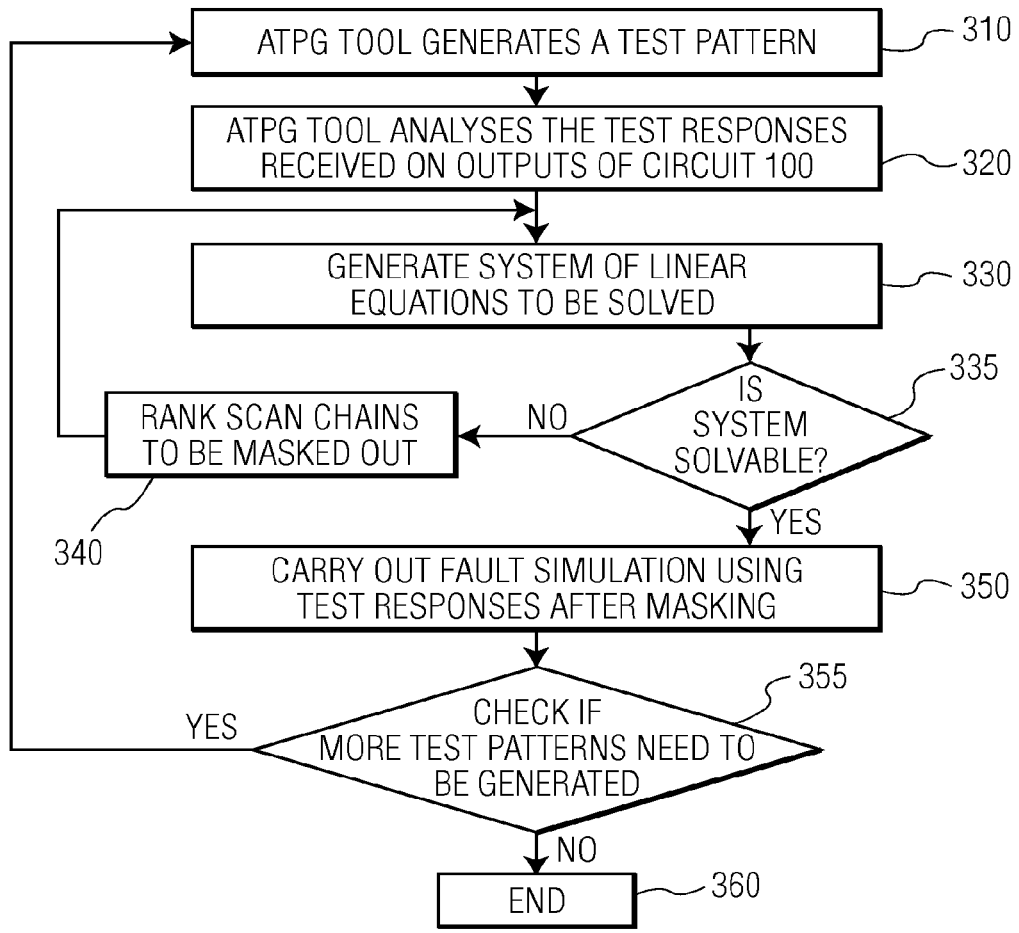
FIG. 3 shows a flowchart of the steps of the method of the present invention.

FIG. 3 shows a flowchart of the steps of the method of the present invention. Such steps are typically implemented by an ATPG tool. In a first step 310, the ATPG tool generates a test pattern that detects certain faults, i.e. target faults. The test pattern comprises the test stimuli and the corresponding test responses. In next step 320, the ATPG tool analyses the test responses received on the outputs of circuit portion 100, to identify all tri-state, unknown, and unreliable responses that should be masked, as well as to identify the essential responses that should not be masked. Essential responses are those responses that should be observed in order to detect the target faults.

In step 330, the system of linear equations, derived from symbolic simulation of the masking logic 150 operation, can next be solved to determine the masks for the masking logic 150. The system contains equations for all X responses from the CUT 100 that should be masked and all essential response that should not be masked. If the equation system is solvable, which is checked in step 335, then the method can move into step 350, otherwise a ranking of the scan chains or clock cycles that have to be masked out is made in step 340.

In step 340, a ranking is done in to decide if selected scan chains are to be masked in all clock cycles using the masks stored in memory device 115 or if all scan chains are to be masked in selected clock cycles using the mask_all signal generator 130. The best decision is taken, after which the method reverts back to step 330 in which the equation system is tried to be solved again. This process is repeated until the equation system has been solved.

In step 350, a fault simulation is carried out, using the test responses after masking, in order to determine which faults are actually detected. This step is required, since some essential responses may have been masked in case the equation system could not be solved. The target faults that are not detected are targeted by the ATPG again when generating subsequent patterns. In step 355 it is checked if more test patterns have to be generated. If not, the method terminates in step 360; otherwise the method reverts back to step 310

It will be appreciated that the ATPG tool and the test arrangement of the IC of the present invention are interrelated products of the same invention, because the ATPG tool is required to predict the responses of the circuit portion 100 to the test patterns from test pattern generator 110, and to use these predicted responses to calculate the appropriate bit patterns of the configuration words to be loaded into shift register 125, i.e. to appropriately configure the masking logic 150 of the integrated circuit of the present invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising:
a circuit portion having a plurality of inputs and a plurality of outputs, the plurality of inputs being arranged to receive a test pattern in a test mode of the integrated circuit, the test pattern comprising a plurality of test vectors for feeding to the plurality of inputs in successive clock cycles; and
a test arrangement for testing the circuit portion, the test arrangement comprising:
a test pattern generator for generating the test pattern;
masking logic for masking selected outputs of the plurality of outputs; and
a signal generator coupled to the masking logic, the signal generator for generating a masking signal triggering the masking of all of said circuit portion outputs only during selected cycles of the successive clock cycles, the signal generator being responsive to clock cycle selection data.

2. An integrated circuit as claimed in claim 1, wherein the signal generator comprises a clock cycle counter and a comparator for comparing the clock cycle selection data with the clock cycle counter value.

3. An integrated circuit as claimed in claim 2, wherein the clock cycle selection data comprises a plurality of bits, the clock cycle counter comprises a plurality of counter bits and the comparator comprises a plurality of logic gates, each logic gate being configured to compare a clock cycle selection data bit with a corresponding counter bit, the signal generator being configured to generate the masking signal when at least one of the clock cycle selection data bits matches the corresponding counter bit.

4. An integrated circuit as claimed in claim 1, further comprising means for inverting the masking signal.

5. An integrated circuit as claimed in claim 4, wherein said means comprise an exclusive logic gate being responsive to the masking signal and an inversion signal.

6. An integrated circuit as claimed in claim 1, wherein the test arrangement further comprises a memory device for storing a plurality of multi-bit masks, the masking logic being configurable by said masks, the memory device being responsive to mask selection data.

7. An integrated circuit as claimed in claim 6, wherein the test arrangement further comprises a plurality of logic gates coupled between the memory device and the masking logic such that each logic gate is responsive to one bit from a multi-bit mask, each logic gate further being responsive to the masking signal.

8. An integrated circuit as claimed in claim 6, wherein the memory device is responsive to a further inversion signal for inverting a multi-bit mask selected by the mask selection data.

9. An integrated circuit as claimed in claim 6, wherein the masking logic comprises a mask generator for generating further multi-bit masks in response to compressed masking data ($m_1$-$m_n$), the masking logic further comprising a plurality of logic gates, each logic gate having its inputs coupled to one bit of a multi-bit mask and to one bit of a further multi-bit mask respectively.

10. An integrated circuit as claimed in claim 9, wherein the masking logic further comprises a further plurality of logic gates coupled between the plurality of logic gates of the masking logic and the mask generator, each logic gate of the further plurality of logic gates having its inputs coupled to a bit from a further multi-bit mask and a mask enable signal respectively.

11. An integrated circuit as claimed in claim 1, further comprising a further memory device for storing a plurality of test configuration words, each of said words comprising: the clock cycle selection data; a bit specifying the inversion signal; the mask selection data; a further bit specifying the further inversion signal; and the compressed mask selection data.

12. An integrated circuit as claimed in claim 1, further comprising an output coupled to the masking logic via data compression logic.

13. A method of generating test data for an integrated circuit as claimed in claim 1, the method comprising:
  generating a test pattern for feeding to the plurality of inputs over a plurality of clock cycles;
  determining the expected responses to the test pattern on the plurality of outputs, the expected responses including undefined values;
  determining, for said test pattern, the clock cycles in which all outputs from said plurality of outputs need masking;
  generating clock cycle selection data for configuring the signal generator to generate the masking signal in the determined clock cycles; and
  generating masking data for the undefined values in unmasked clock cycles.

14. A method as claimed in claim 13, further comprising generating an inversion bit for inverting the masking signal.

15. A method as claimed in claim 13, wherein the step of determining the clock cycles in which all outputs from said plurality of outputs need masking further comprises:
  determining the outputs that need masking during all clock cycles;
  providing a mask for masking said determined outputs; and
  storing said mask in a memory device of the integrated circuit.

16. A method as claimed in claim 15, wherein the step of determining the clock cycles in which all outputs from said plurality of outputs need masking and the step of determining the outputs that need masking during all clock cycles are executed in combination with the objective to minimize the masking of expected responses having defined values.

17. An automated test pattern generation tool implementing the steps of the method as claimed in claim 13.

* * * * *